United States Patent [19]

Hanna et al.

[11] Patent Number: 5,027,016
[45] Date of Patent: Jun. 25, 1991

[54] LOW POWER TRANSIENT SUPPRESSOR CIRCUIT

[75] Inventors: John E. Hanna, Meas; Behrooz L. Abdi, Chandler, both of Ariz.

[73] Assignee: Motorola, Inc., Schaumburg, Ill.

[21] Appl. No.: 291,833

[22] Filed: Dec. 29, 1988

[51] Int. Cl.$^5$ .......................... H03K 5/00; H03K 3/01; H03K 17/16; G05F 3/16
[52] U.S. Cl. ................................ 307/542; 307/296.6; 307/546; 307/443; 323/315
[58] Field of Search ............... 307/542, 544, 546, 553, 307/557, 443, 296.1, 296.4, 296.6, 296.7; 323/312, 315

[56] References Cited

U.S. PATENT DOCUMENTS 4,567,537 1/1986 Kalkhof et al. ...................... 323/312
4,590,389 5/1986 Cave et al. .......................... 307/542

Primary Examiner—Stanley D. Miller
Assistant Examiner—Trong Phan
Attorney, Agent, or Firm—Michael D. Bingham

[57] ABSTRACT

A deglitch circuit for suppressing transient signals that appear at an output node includes a bias circuit for providing a bias signal; a transistor having its collector-emitter conduction path coupled in series to the output node and having a base coupled to the bias signal; and a capacitive element coupled between the output node and the base of the transistor for rendering the transistor conductive in response to a transient signal such that a low impedance circuit path is presented to the transient signal.

2 Claims, 1 Drawing Sheet

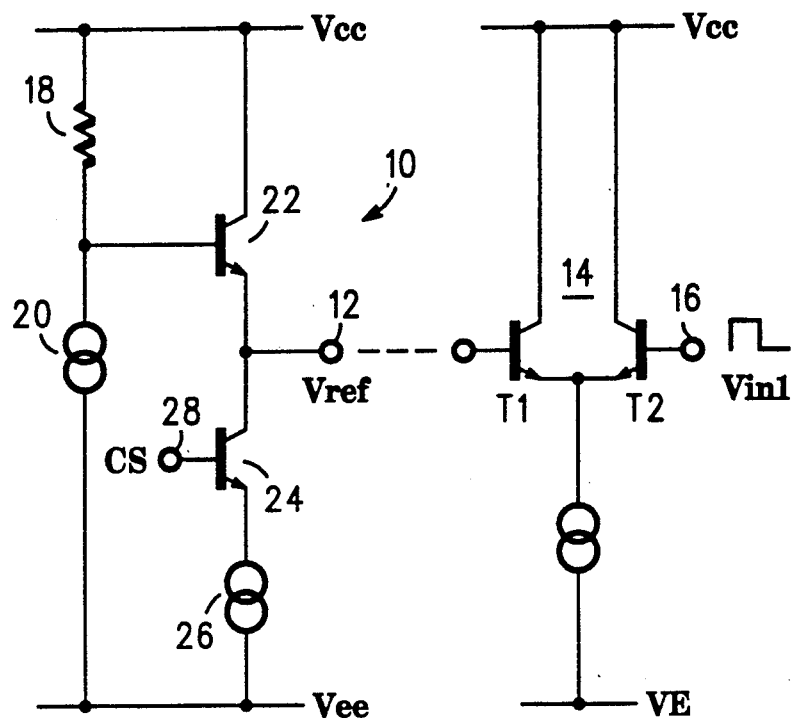
FIG. 1
—PRIOR ART—
FIG. 2
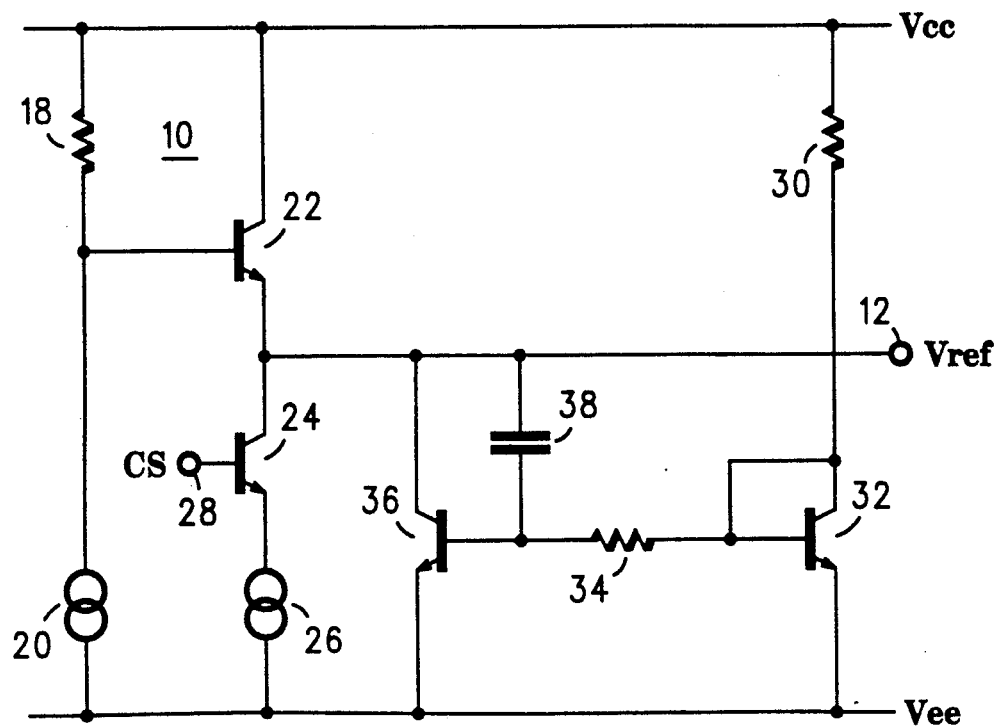

LOW POWER TRANSIENT SUPPRESSOR CIRCUIT

BACKGROUND OF THE INVENTION

The present invention relates to voltage bias reference circuits, and, more particularly, to a circuit for coupling to the output of such reference circuits for suppressing high speed glitches that may appear at the output. Voltage bias reference circuits for providing a voltage bias signal to single or multiple utilization means are widely known. An example of a simple voltage reference circuit includes an NPN emitter follower stage the emitter of which is coupled to the output of the circuit for providing a reference voltage thereat in response to a predetermined current being supplied to its base. The output of the voltage reference circuit may be used to provide a bias signal to one or more loads coupled thereat.

In a typical application, the output reference voltage is utilized to provide biasing to the base of one transistor of a differential amplifier which receives a switching signal at the base of the second input transistor of the amplifier. The output of the differential amplifier will thus switch between first and second operating states whenever the applied switching signal passes above or below the reference voltage supplied to the one transistor as is well known. In some applications, multiple differential amplifiers may have one input thereof coupled to the output of the voltage reference circuit which are switched between operating states by respective switching signals. Due to base-emitter capacitive coupling through the differentially coupled transistors, it is possible to have high speed dV/dt signals appearing at the output of the voltage reference circuit due to the respective switching signals. If these dV/dt signals are sufficiently high in magnitude, the emitter follower stage of the voltage reference circuit can be turned off thereby increasing the output impedance of the circuit. This results in a glitch signal at the output of the reference circuit which is highly undesirable as the operating states of different ones of the multiple differential amplifier loads may then be incorrectly switched.

Thus, what is needed is a circuit for utilization with the voltage reference circuit for suppressing or severely reducing the aforementioned glitches.

SUMMARY OF THE INVENTION

Accordingly, it is an object of the present invention to provide an improved glitch suppressor circuit.

It is another object of the present invention to provide a circuit in combination with a voltage reference circuit for suppressing dV/dt signals appearing at the output of the reference circuit.

Yet another object of the present invention is to provide a low power consuming high frequency deglitch circuit for use with a voltage reference circuit.

In accordance with the above and other objects there is provided a deglitch circuit for suppressing transient signals that appear at an output node comprising a bias circuit for providing a bias signals; a transistor having its collector-emitter conduction path coupled in series to the output node and having a base coupled to the bias signal; and a capacitive element coupled between the output node and the base of the transistor for rendering the transistor conductive in response to the transient signal such that a low impedance circuit path is presented to the transient signal.

It is a feature of the present invention that the deglitch circuit is coupled to the output node of a voltage reference circuit, the latter of which provides a reference voltage at the output node.

The above and other objects, features, and advantages of the present invention will be better understood from the following detailed description taken in conjunction with the accompanying drawings.

BRIEF DESCRIPTION OF THE DRAWING

FIG. 1 is a schematic diagram illustrating a simplified voltage reference circuit; and FIG. 2 is a schematic diagram of the deglitch circuit of the present invention used in combination with the voltage reference of FIG. 1.

DETAILED DESCRIPTION OF THE PREFERRED EMBODIMENT

Turning to FIG. 1 there is shown a conventional voltage reference circuit 10 which is suited to be manufactured in integrated circuit form. Voltage reference circuit 10 provides a fixed bias voltage, Vref, at output 12 that is used to provide a bias voltage to load utilization means coupled thereat. Reference circuit 10 includes resistor 18 series coupled to current supply 20 between first and second power supply conductors at which the operating power supplies Vcc and Vee are applied. The interconnection between resistor 18 and current supply 20 is coupled to the base of NPN transistor 22 which is configured as an emitter follower having its emitter coupled to output 12. The emitter of transistor 22 is also coupled to the collector of NPN transistor 24 the emitter of which is coupled to current supply 26. Current supply 26 may be realized by a resistor. The base of transistor 24 may be biased by potential supplied thereto or, as shown, may receive a control signal at terminal 28 for controlling the conduction of both transistors.

In operation, base current drive is supplied through resistor 18 to transistor 22, which when turned on by transistor 24 being rendered conductive provides the voltage Vref at output 12. Typically, the magnitude of Vref is equal to:

$$V_{cc} - (V18 + V_{BE}) \tag{1}$$

Where V18 is the voltage developed across resistor 18 and $V_{BE}$ is the base to emitter voltage of transistor 22.

Vref may be used to bias several different load utilization means, for example, one or more differential amplifiers 14 each having a pair of differentially connected transistors T1 and T2. Each differential amplifier 14 can have one input thereof (the base of transistor T1) coupled to output 12 of reference circuit 10 while the other input 16 (the base of transistor T2) receives a switching signal Vin. In this application, transistors T2 is switched between conduction states as the magnitude of Vin varies about Vref.

Input signal Vin is coupled onto output 12 of reference circuit 10 through the base-emitter capacitance of transistors T1 and T2. During the fall time of Vin, the coupled signal tends to draw more current out of the emitter of transistor 22 which turns it on harder and reducing the output impedance appearing at output 12. However, during the rise time of Vin, current is pushed into the emitter of transistor 22 which tends to turn it off and increasing the output impedance significantly. This shows up as a glitch signal at the output 12. Thus, if multiple differential amplifiers were coupled to output 12, this glitch, if of sufficient magnitude, could cause these multiple differential amplifiers to be erroneously switched. This may be highly undesirable.

One method for reducing the aforementioned glitch problem is to ensure that transistor 22 is not turned off during the rise time of Vin by biasing it harder on in the quiescent operating state of reference circuit 10. However, this in turn increases the power dissipation of the reference circuit which may also be undesirable.

Referring now to FIG. 2 there is illustrated reference circuit 10 to which the glitch suppressor circuit of the present invention is coupled for reducing the effects of glitches while consuming little additional power. The deglitch circuit includes a biasing circuit comprising resistor 30 that is series coupled to diode connected transistor 32 between Vcc and Vee, resistor 34, transistor 36 and capacitor 38. The base of transistor 36 is coupled to diode connected transistor 32 via resistor 34 and has it collector-emitter coupled between output 12 and Vee. Capacitor 38 is coupled between output 12 and the base of transistor 36 to provide capacitive couplig to the latter responsive to the dV/dt switching signal that is coupled to output 12 through transistors T1 and T2 as described above. It is understood that capacitor 38 is illustrative only and that any suitable capacitive means may be employed.

Depending on the frequency response of the deglitch circuit, transistor 36 will be turned on by the coupled switching signal to provide a short circuit thereto which reduces the effects of glitches as the output impedance at output 12 will also decrease.

It has been observed that the subject deglitch circuit has reduced the glitch energy appearing at output 12 from approximately 3.2 nV-sec. to 0.19 nV-sec.; more than 16 times improvement over the reference circuit described which does not include the present invention.

Hence, what has been described above is a novel network for suppressing or severely reducing glitches occuring at the output of a voltage reference circuit utilized to supply a voltage bias signal to multiple switching loads.

What is claimed is:

1. A voltage reference circuit for providing a reference voltage at an output thereof, comprising:
    a first transistor configured as an emitter-follower and having the emitter thereof coupled to the output, said first transistor being responsive to base current drive being supplied to its base for providing the reference voltage;
    circuit means coupled to the base of said first transistor for supplying base current drive thereto;
    bias means for providing a substantially constant bias potential;
    a second transistor having a base, a collector and an emitter, said collector being coupled to the output of the voltage reference circuit, said emitter being coupled to a power supply conductor;
    resistive means for coupling said base of said second transistor to said bias means; and
    capacitive means for coupling said base of said second transistor to the output of the voltage reference circuit wherein any positive glitches appearing at the output of the voltage reference circuit are reduced by said second transistor being rendered more conductive responsive thereto.

2. A circuit for providing a reference voltage at an output terminal, comprising:
    circuit means for providing a substantially constant bias potential at an output thereof;
    a transistor having a collector, a base and an emitter, said collector being coupled to the output terminal of the circuit, and said emitter being coupled to a power supply conductor;
    a resistor coupled between said base of said transistor and said output of said circuit means, said resistor providing alternating current (AC) isolation between said base of said transistor and said circuit means to any positive voltage transients occuring at the output terminal; and
    capacitive means directly connected between said base of said transistor and the output terminal for capacitively coupling positive voltage transients occuring at the output terminal to said base to render said transistor more conductive responsive thereto to thereby reduce the positive transients.

* * * * *